United States Patent [19]

Reich et al.

[11] Patent Number: 5,706,070
[45] Date of Patent: Jan. 6, 1998

[54] NONCONDUCTING, NONRADIATING REMOTE VISUAL AND AUDIO COMMUNICATION SYSTEMS

[75] Inventors: Stanley M. Reich, Jericho; Daniel R. Tufano, Setauket, both of N.Y.

[73] Assignee: Northrop Grumman Corporation, Los Angeles, Calif.

[21] Appl. No.: 703,753

[22] Filed: Aug. 27, 1996

[51] Int. Cl.$^6$ .................... A61B 3/08; A61B 3/00
[52] U.S. Cl. .................... 351/201; 351/200
[58] Field of Search .................... 351/200, 201, 351/205, 246, 158, 41

[56] References Cited

U.S. PATENT DOCUMENTS 5,026,151  6/1991  Waltuch et al. .................... 351/201

Primary Examiner—Hung X. Dang
Attorney, Agent, or Firm—Terry J. Anderson; Karl J. Hoch, Jr.

[57] ABSTRACT

A nonconducting, nonradiating remote communication system for use with medical research, diagnostic, and therapeutic instruments without disturbing the operation of those instruments, in which an image generator such as a CRT generates an image or stereo images to be viewed by a patient while the patient is being examined by the instrument. A fiber optic bundle relays the generated image to an eyeglass assembly worn by the patient. The eyeglass assembly comprises left and right image relay lens systems for relaying the images to the left and right eyes of the patient, and a mirror positioned between each relay lens system and the eye to reflect an image onto the eye. Each relay lens system can comprise a conventional relay lens system, or a graded index relay lens system, or a binary optic relay lens system. Each mirror can comprise a prism, or a pellicle mirror, a holographic mirror, or a binary optics mirror.

24 Claims, 8 Drawing Sheets

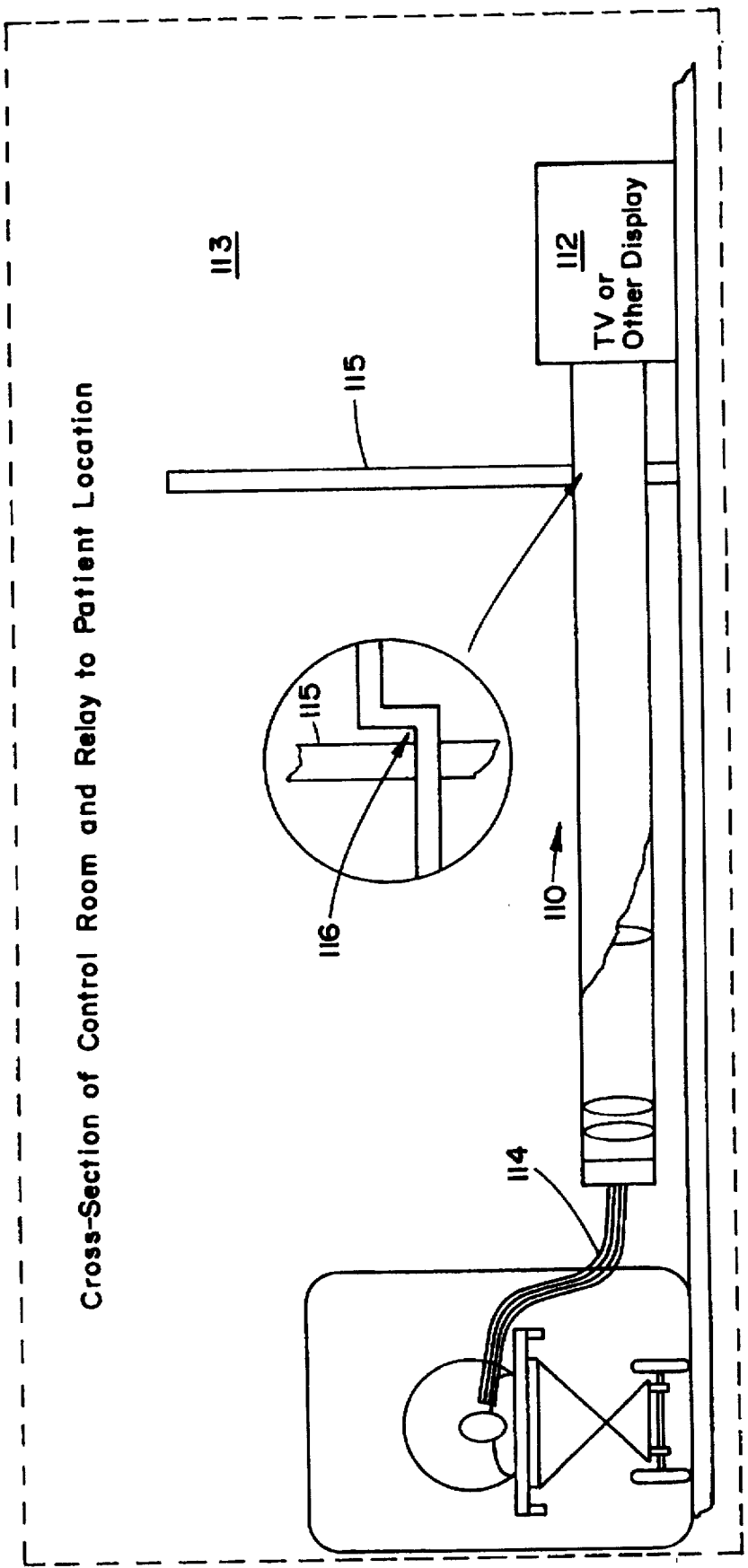

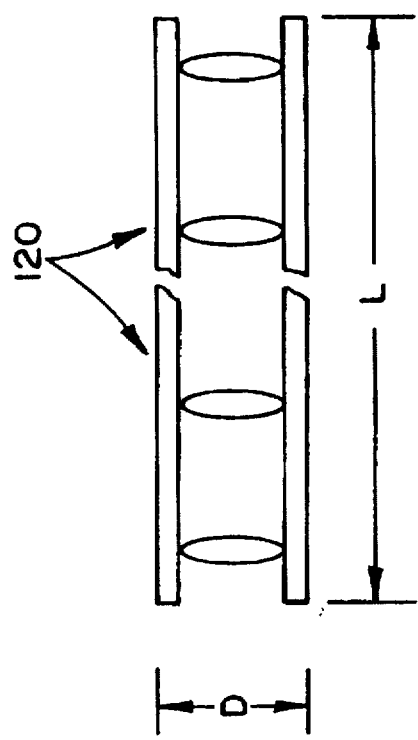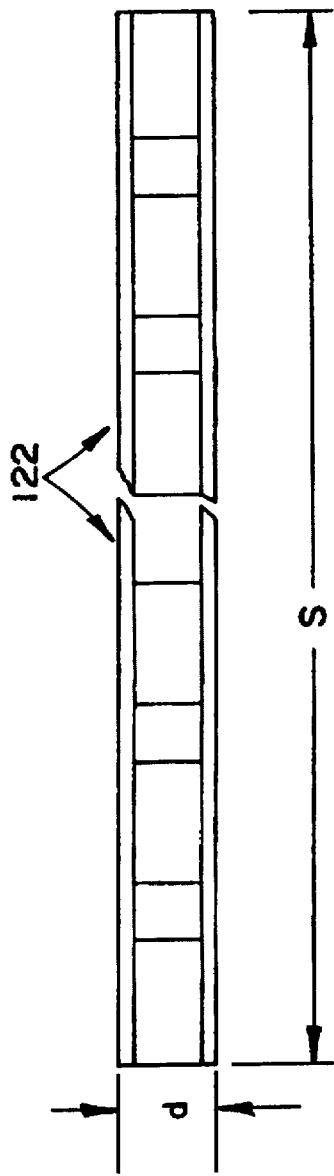

NONCONDUCTING, NONRADIATING REMOTE VISUAL AND AUDIO COMMUNICATION SYSTEMS

BACKGROUND OF THE INVENTION

1. Field of the Invention

The present invention relates generally to nonconducting, nonradiating remote visual and audio communication systems, and more particularly pertains to such remote visual and audio communication systems for use with medical research, diagnostic, and therapeutic instruments without disturbing the operation of those instruments.

2. Discussion of the Prior Art

The performance of some medical research diagnostic and therapeutic instruments could be improved if the patient could respond to visual commands and stimuli provided by the equipment operator (technician, doctor, etc.) during the diagnostic or therapeutic procedure. Problems arise particularly with magnetic resonance imaging (MRI) instruments, positron emission tomograph (PET) instruments, and single photon emission computerized tomograph (SPECT) instruments. All of these instruments have confined regions wherein the patient is located, making it very difficult to position therein conventional video monitors, particularly if stereo or binocular viewing is required. In addition, some electrical apparatus, such as a video monitor, and some glass optics would seriously disturb, distort, and more importantly attenuate, the radiation field, particularly gamma radiation fields (usually introduced into the patient by radioactive dyes and gases) which contain latent image information which is sensed by the detecting instruments. Additionally, with MRI instruments the changing magnetic fields could couple into the monitor electronics and possibly cause serious damage.

Present instruments may provide for audio communications via a loudspeaker and microphone remotely located from the instrument, but none are known to have any visual or audio system within the instruments. Some PET and SPET instruments used in research have a remote TV monitor and a large mirror placed outside the area of the rotating head thereof to reflect an image to the patient. A problem with this optical arrangement is that it places the image far away from the patient, making it difficult to resolve details and small font in the display.

In MRI instruments, a long tunnel closely surrounds the patient which seriously restricts the field of view of such a mirror-TV monitor arrangement. Additionally, with MRI instruments the monitor must be positioned far from the instrument in order to prevent interference, which further reduces the field of view. Open MRI systems might provide more space but are more limited in sensitivity.

Research in brain related diseases such as Alzheimers involves the use of radioactive tracers sent to the brain via blood flow. The gamma rays emitted by the tracers are detected by an array of photomultipliers and a crystal which converts them to photons.

These experiments and future diagnostic tests resulting from further development in these fields require a high resolution, full field of view visual display. This requires that the display exit pupil be in close proximity to the eye. A difficulty with this approach is that the display components are normally too large to fit in that location when the scanning heads are in place. More importantly, the display assembly will significantly attenuate the gamma radiation. A similar situation, potentially more dangerous to the patient, occurs if one wants to place any electronic instrumentation within the magnetic field of an MRI. The tunnel associated with the MRI equipment leaves little or no room for such display instrumentation.

Research on the brain has encompassed anatomy, chemistry and physiology. Some branches seek to link psychological functions (e.g., perception and memory) to physiological correlates. One area known as psychophysiology has attempted to identify anatomical structures, or small populations of neurons, with particular functions. This endeavor, generally referred to as "mapping", has been conducted with ever increasing levels of resolution. One sophisticated goal is to uncover physiological processes which account for, or mediate, the pyscophysiological processes.

The general procedure used in this type of brain research is to have a subject doing or experiencing something which would exercise the psychological function of interest, while the researcher records various measures of physiological activity. Several measurement procedures have been used. One involves implanting an electrode within the cortex to record firing activity of a single neuron. Single cell recordings have been limited to nonhuman subjects, and researchers have tried many kinds of stimulation to determine what the single cell responds to. Electro-encephalograms (EEG's) involve the use of electrodes placed on the surface of the scalp to measure time variant activity levels of millions of neurons. EEG's have a fairly good temporal resolution but have obvious limitations in their ability to resolve neural structures small enough to be of much theoretical use. A metabolic stain, known as 2-dioxyglucose, has been injected into nonhuman subjects immediately before they experience a pattern of stimulation (e.g., visual). The subjects are then decapitated as quickly as possible after the stimulation. The brains are quickly frozen and sliced in a microtome. Researchers then examine the slices to determine which areas of the brain have absorbed the stain; thus showing which cell populations were metabolizing most at the moment of stimulation. This latter procedure, although quite a breakthrough in the 1970's, has some obvious drawbacks.

In the 1980's brain researchers began to use noninvasive scanning and tomography techniques, such as PET, SPECT and MRI instruments, to perform psychophysiological research on conscious human subjects. This area is advancing and represents a major breakthrough in the field. One major limitation is the inability to present and control visual and auditory stimuli to subjects, and to record behavioral data such as manual responses.

SUMMARY OF THE INVENTION

Accordingly, it is a primary object of the present invention to provide nonconducting, nonradiating remote visual and audio communication systems.

A further object of the subject invention is the provision of a compact nonconducting, nonradiating remote visual and audio communication system for use with medical research, diagnostic, and therapeutic instruments which does not disturb the operation of those instruments.

Interaction between a patient and a doctor is a longstanding procedure in medicine. A low profile, non-conducting and non-absorbing image generating system advantageously allows a patient to interact with an operating technician or physician, during which the patient can respond to stimuli or therapeutic action taken by the operator. The technology of the present invention expands these procedures to a new class of diagnostic instruments.

Such an image generating system permits the presentation of complex and dynamic stimuli to patients, thus allowing an increase in the sophistication of stimuli and test approaches used in neurological research and diagnosis.

Positioning an optical interface close to a patient's eyes permits the display of information with resolution to super VGA and beyond, providing the patient with the ability to read font sizes smaller than 6 pica. This is accomplished by an optical delivery system which uses appropriate materials (e.g. plastic lenses, etc.) in regions where radiation is present. The instrument exit pupil is preferably positioned close to the patient, which allows high resolution and large images to be displayed.

Another advantage of the system of the present invention is that of calming down those estimated 25% of patients who will not go in an MRI because of claustrophobic feelings. These claustrophobic patients could be shown a first run movie to distract them from the claustrophobic effects of the closed-in region.

In accordance with the teachings herein, the present invention provides a nonconducting, nonradiating remote communication system for use with medical research, diagnostic, and therapeutic instruments without disturbing the operation of those instruments, in which an image generator generates an image to be viewed by a patient while the patient is being examined by the instrument. A fiber optic bundle relays the generated image to an eyeglass assembly worn by the patient. The eyeglass assembly is optically coupled to the fiber optic bundle for receiving an image therefrom, and comprises left and right image relay systems for relaying the image to the left and right eyes of the patient.

In greater detail, each image relay system includes a relay lens system and a mirror positioned between each relay lens system and each eye to reflect an image onto the eye. Each relay lens system can comprise a conventional relay lens system, or a graded index relay (GRIN) lens system, or a binary optic relay lens system. The mirror can comprise a prism, or a pellicle mirror, a holographic mirror, or a binary optics mirror. The eyeglass assembly is secured to the head of the patient, such as by left and right ear-securing temple pieces extending over the left and right ears of the patient.

The fiber optic bundle preferably extends close to the body of the patient and is secured to the eyeglass assembly in a direction substantially normal to the line of sight or vision of the patient, and the eyeglass assembly transfers the image through a substantially normal angle into the line of vision of the patient. A beam splitter is secured to the end of the fiber optic bundle for splitting a single image into left and right images to be viewed by the left and right eyes of the patient. In one embodiment, the eyeglass assembly includes an image lens, an eye lens, and a mirror, and the eye lens is adjustable to control the size or focus of the image.

In another embodiment two images can be provided, each in the form of a separate video image of a scene or object. Each video camera recording the scene is spatially located so as to produce a stereo effect. Similarly, appropriately generated (by computer or other means) electronic scene video can be used to produce the stereo effect. The video taken or generated from the left side of the scene is fed to the CRT that feeds the left eye and the video taken or generated from the right side of the scene is fed to the CRT that feeds the right eye. This embodiment can be used in conjunction with advanced physiological experiments, or to provide stereo entertainment. The nonconducting, nonradiating remote communication system can also include a further relay lens system optically connecting the image generator to the fiber optic bundle, with an optional periscope section in the relay lens system. The further relay lens system can be a conventional relay lens system, or can comprise a graded index relay lens system.

The nonconducting, nonradiating remote communication system can also include a hollow audio tube extending to the ears of the patient to enable audio sound messages to be conducted to and heard by the patient. The system can also include an optical transfer transducer which is manually operated by the patient to enable the patient, by manual manipulation of the optical transfer transducer, to communicate messages to the operator of the diagnostic equipment.

BRIEF DESCRIPTION OF THE DRAWINGS

The foregoing objects and advantages of the present invention for nonconducting, nonradiating remote visual and audio communication systems may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 5 illustrates details of a rigid image relay assembly which relays an image from a television or other display in a control room area to a fiber optic bundle for transmission to a display located near a patient within a diagnostic instrument;

FIG. 6 is a cross-sectional view of a conventional relay lens system;

FIG. 7 is a cross-sectional view of a graded index (GRIN) type of relay lens system.

DETAILED DESCRIPTION OF THE DRAWINGS

Figure 1:
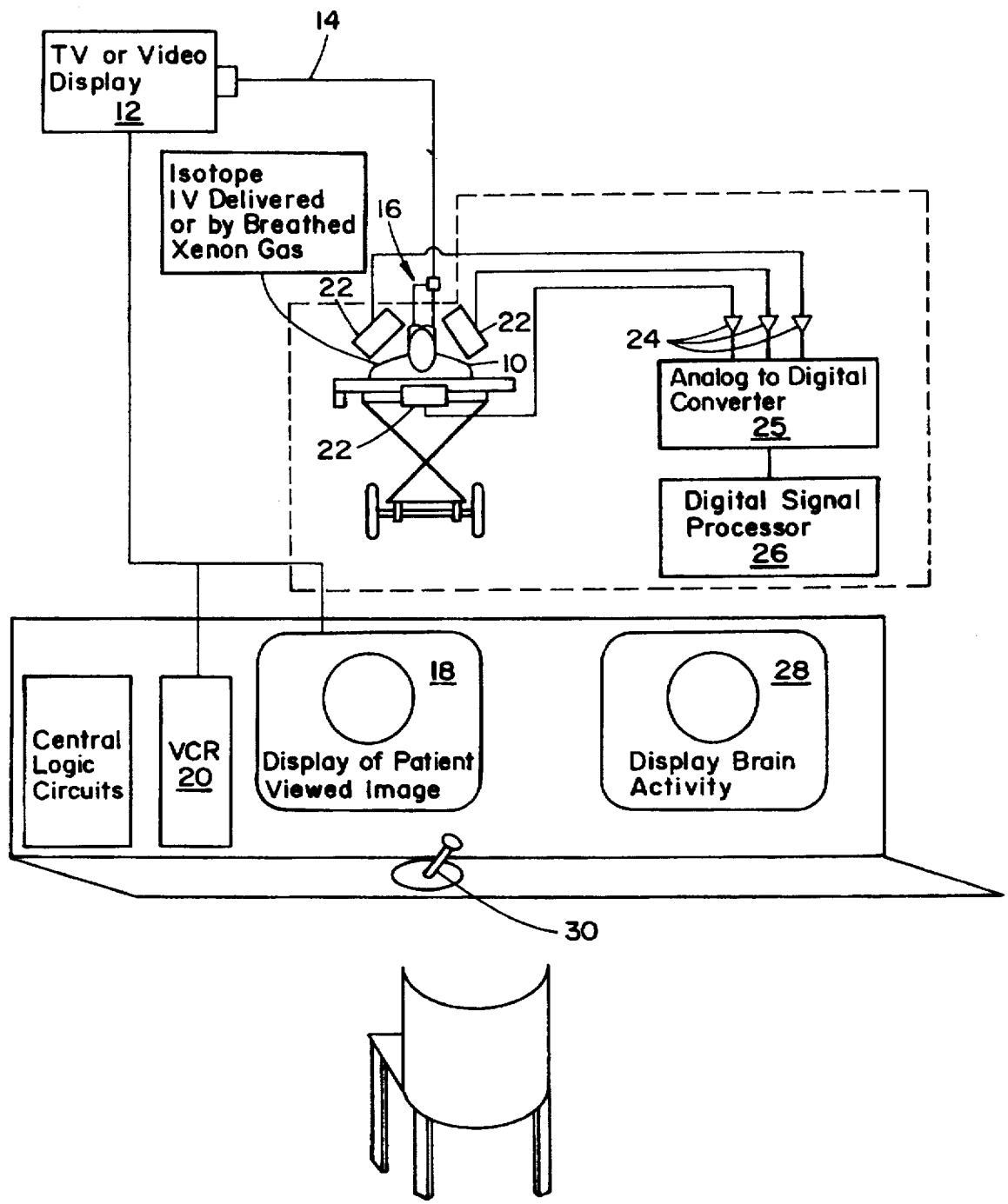
FIG. 1 illustrates a schematic block diagram of a PET control system having a nonconducting, nonradiating remote visual and audio communication system pursuant to the present invention.

Referring to the drawings in detail, FIG. 1 illustrates a schematic block diagram of a PET control system with manual interaction having a nonconducting, nonradiating remote visual and audio communication system pursuant to the present invention. In this system a patient 10 is able to view images from a TV or video display 12 which are transferred by a coherent fiber optic bundle relay delivery system 14 to a stereoscopic viewer 16, as illustrated in further detail in the ensuing Figures. The patient viewed image is also presented to the equipment operator (e.g. doctor, technician) by display 18 and recorded by a VCR 20. Three sensors 22 surround the head of the patient, the outputs of which are amplified at 24, converted by A/D converters at 25, processed at 26, and the output of the processor is displayed at 28, which presents a display of the brain activity. FIG. 1 illustrates a remote control area in which an operator can both control and view images shown to a patient, and at the same time monitor the output (such as raw data) from the PET, or other scanner, during the procedure. A control 30 enables the operator to change and control the images displayed to the patient.

The source 12 for the visual and audio stimuli which is transmitted through the signal channel 14 is located outside the sensitive region near the patient. In some embodiments the source 12 this could be placed along side or below the patient, and in other embodiments the source 12 might be in a remote instrument control room.

The images for the display can be generated from a variety of sources including, but not limited to, video tapes, live TV, computer generated displays, or an appropriate scanner to transfer information directly from media such as film. The visual display system can be implemented in either color or black and white embodiments.

FIG. 1 illustrates an embodiment in which an audio signal for either entertainment, or patient/doctor interaction, is sent in monaural and/or stereo from a convenient location via plastic, polymer, or glass tubing and earphones to the patient. The concept of communicating via air through a tube is quite old but is unique to this metal/electronic free environment.

Figure 2:
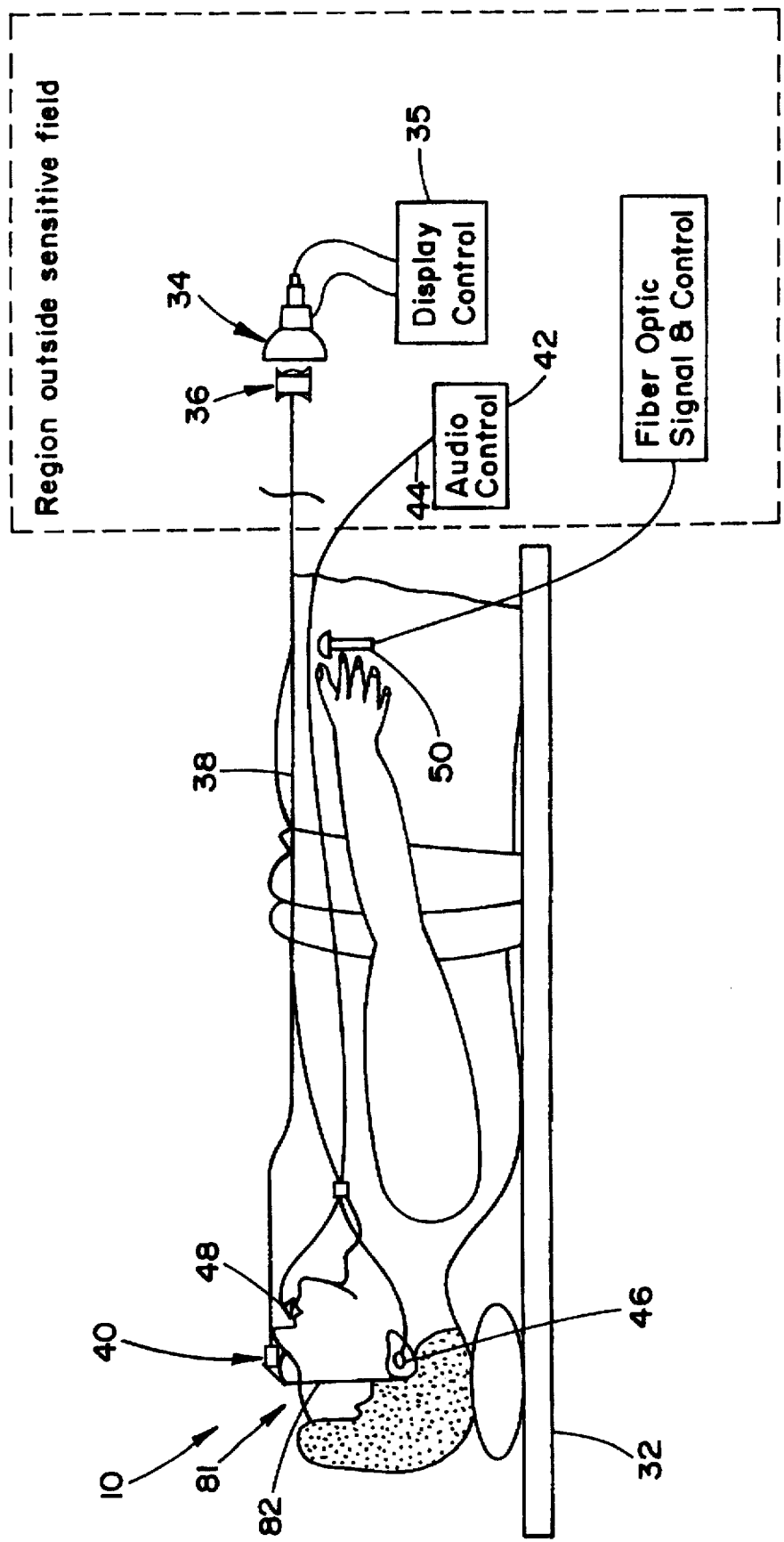
FIG. 2 is a schematic illustration of a low profile, nonconductive visual, audio and physical response communication system for a patient in an environment not allowing normal electrical communication between the patient and a physician or the operating technician.
Figure 3:
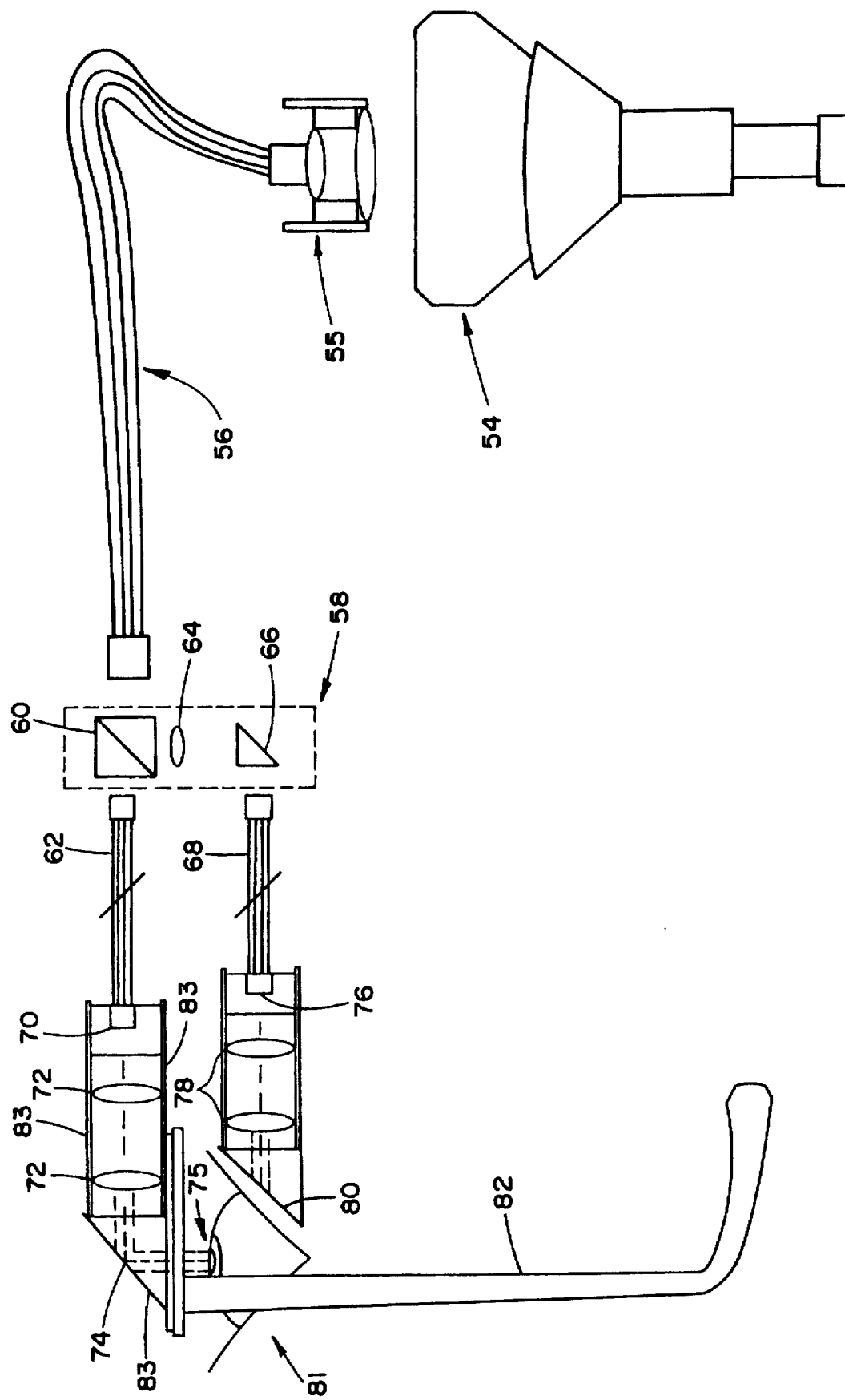
FIG. 3 illustrates an all fiber optic binocular link embodiment of a visual communication system pursuant to the present invention.

Additionally, a stereo visual display can be readily incorporated into the video system by replacing the common video source of FIGS. 1, 2 and 3 with two separate video sources. In these embodiments, each video source displays an image which when viewed with the other image, forms a stereo pair of images for the viewer.

FIG. 2 illustrates further details of an embodiment of the present invention wherein a patient 10 lying prone on a table 32 is fitted with a low profile, non-conducting visual, audio and physical response system pursuant to the present invention. A display 34 such as a CRT generates images under the control of a display control system 35 which are transferred by coupling optics 36 to a coherent fiber optic bundle 38, which are then transferred to a stereo or binocular eye lens assembly 40 for display to the patient. An audio signal is generated at 42 and transferred by a hollow sound tube 44 to earpieces 46 worn by the patient. The patient may also be fitted with a mouthpiece 48 to direct sound to a sound tube to enable the patient to communicate verbally with the operator. The patient is also provided with a tactile fiber optic control 50, as illustrated in further detail in FIG. 8, to enable the patient to communicate nonverbally with the equipment operator.

FIG. 3 illustrates an all fiber optic (without an associated relay lens system as illustrated in FIGS. 5–7) binocular/ stereo link embodiment of a visual communication system pursuant to the present invention. In this embodiment, an image to be displayed to the patient is generated by a small diameter (e.g. 1 inch) display tube 54, and is transferred by an image lens assembly 55 to a coherent fiber optic bundle 56 to a beam splitter assembly 58, which generates left eye and right eye images. The beam splitter assembly 58 can comprise a beam splitter prism 60 which transmits a first image directly to a first coherent fiber optic bundle 62 and reflects a second image through a transfer lens 64 and reflective surface 66 to a second coherent fiber optic bundle 68.

The first coherent fiber optic bundle 62 transfers the image to a ferrule 70 (the ferrule 70 secures and protects the end of the fiber optic bundle 62 from damage, and is concentric with the fiber optic bundle 62 such that it aligns the end of fiber optic bundle 62 to the optical axis of the lens), from which a transfer lens assembly 72 transfers the image for reflection by a reflective surface 74 onto one eye 75 (left or right) of the patient. The second coherent fiber optic bundle 68 includes a similar ferrule 76, transfer lens assembly 78 and reflective surface 80 which transfers the image to the second eye of the patient (FIG. 3 is a schematic illustration, and illustrates the second image transfer system physically transposed from its actual position in which it transfers an image to the second eye).

The patient, as illustrated in both FIGS. 2 and 3, wears an eyeglass assembly 81 having ear mounted supports 82. Referring to FIG. 3, the eyeglass assembly 81 includes a frame 83 which mounts thereon the right and left channel optical components, including the mirrors 74 and 80, the transfer lens assemblies 72 and 78, and the terminating ferrules 70 and 76. The flexible fiber optic bundles 62 and 68 extend along the body of the patient, and enter the eyeglass assembly in a direction substantially at a right angle to the line of sight of the patient, and the eyeglass assembly transfers the left and right images through a substantially 90 degree rotation to the eyes of the patient as illustrated. In alternative embodiments, the eyeglass assembly could be mounted on the patient similar to goggles in a manner in which a strap extends around the back of the head of the patient.

In summary, the left eye and right eye images are transferred by coherent fiber optic bundles to eye lens assemblies, which can include conventional relay lenses or graded refractive index (GRIN) relay lenses, to a mirror, such as a prism, pellicle or holographic mirror, which reflects the image onto the patient's eye.

Figure 3A:
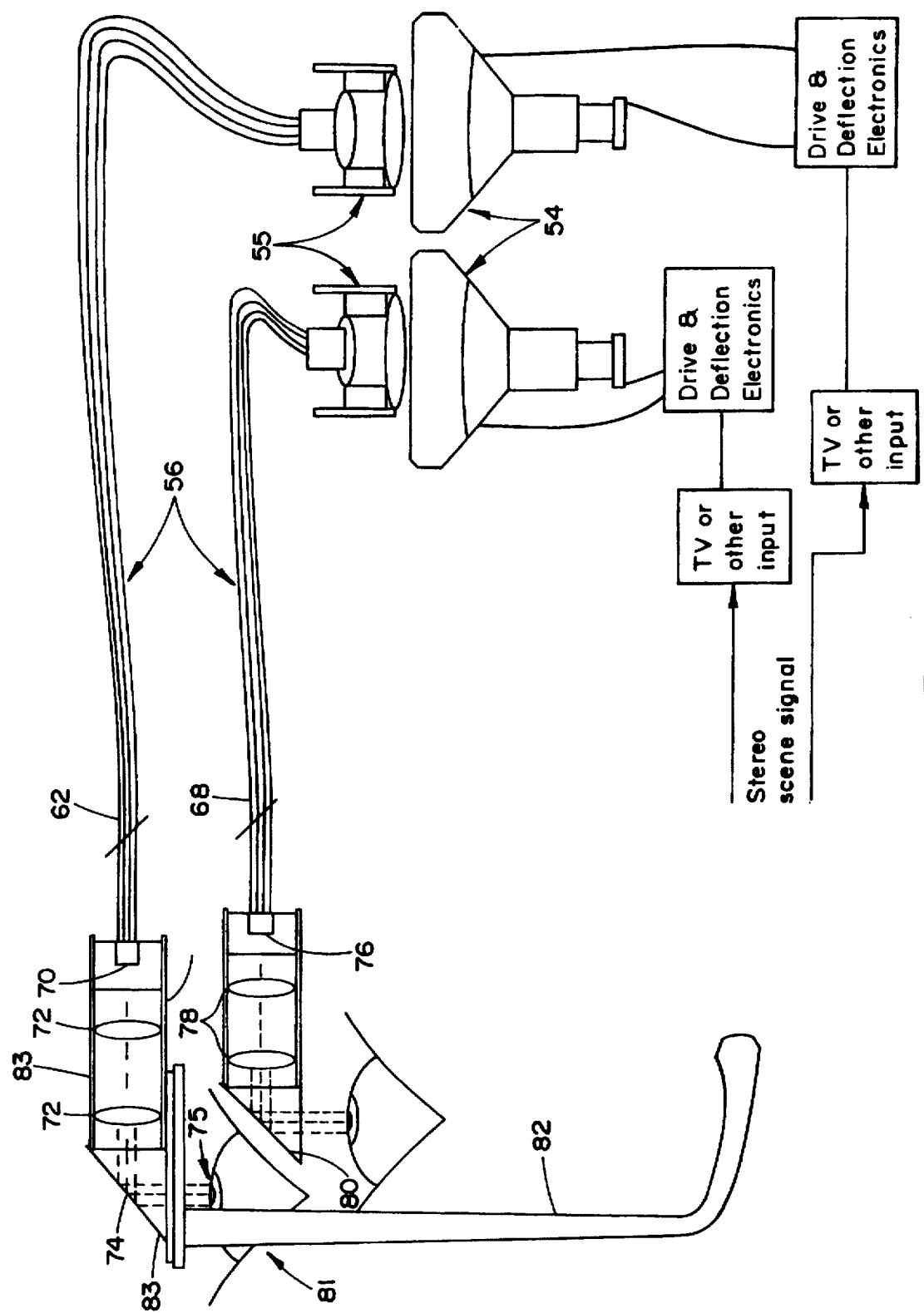
FIG. 3a illustrates an embodiment similar to that of FIG. 3, wherein separate left and right stereo views are generated by separate color CRT displays, and are transferred by left and right image stereo coherent fiber optic bundles to separate left and right image channels of the eyeglass assembly.

Additionally, separate CRTs can provide a different image of the same scene for the left and right eyes to generate a stereo effect. FIG. 3a illustrates an embodiment similar to that of FIG. 3, wherein separate left and right stereo views are generated by separate color CRT displays, and are transferred by left and right image stereo coherent fiber optic bundles to separate left and right image channels of the eyeglass assembly.

The optics for the visual system can be implemented in any one of several embodiments to transfer and focus an image, and some embodiments can utilize either a small thin pellicle or holographic type mirror in place of a prism to reduce optical losses.

Figure 4:
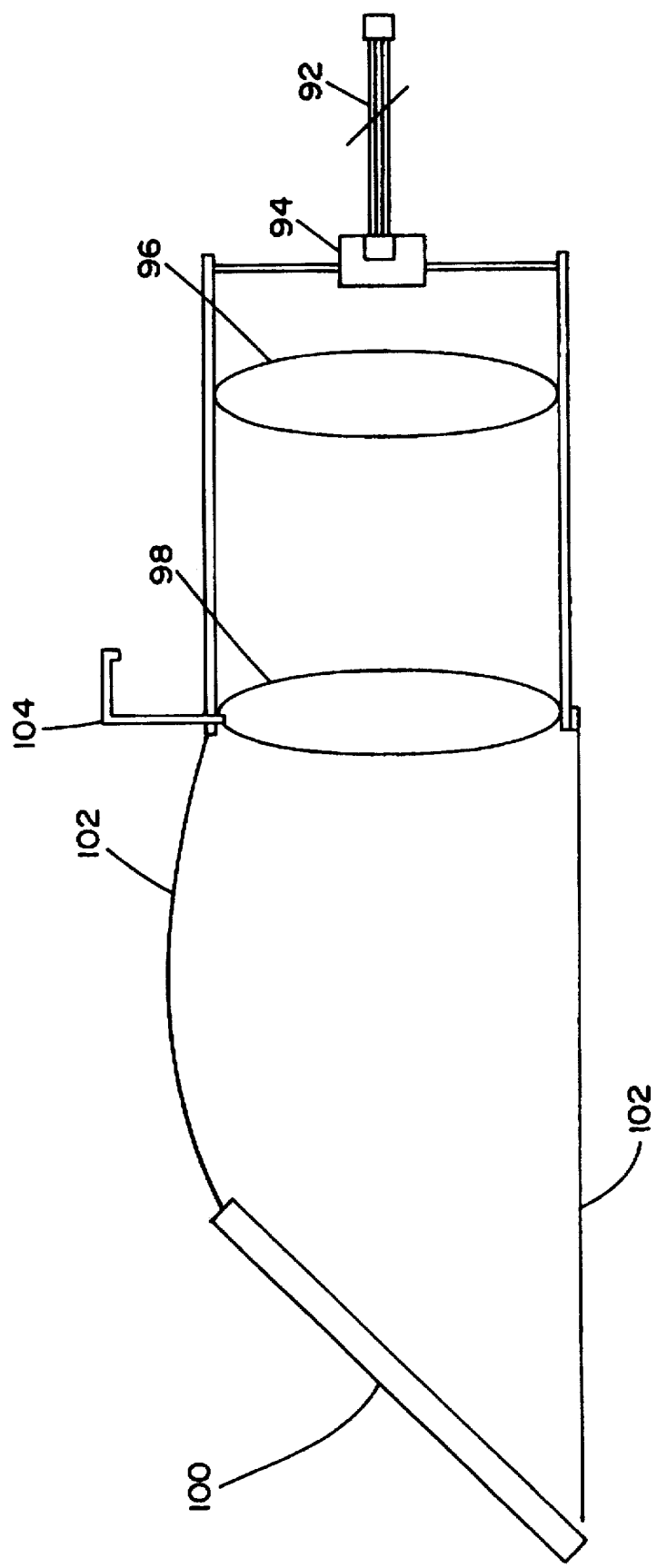
FIG. 4 is a cross-sectional view of one embodiment of a long focal length lens and mirror pursuant to the present invention.

FIG. 4 illustrates an additional embodiment of the present invention having a long focal length lens assembly 96, 98. In this embodiment, the eyeglass assembly receives an image from a coherent optical fiber bundle 92 at a terminating ferrule 94, which is transferred by an image lens 96 and eye lens 98 onto a mirror 100 for reflection onto the eye. A thin plastic support frame 102 secures all of the components to the eyeglass assembly. An adjustment mechanism 104 is associated with the eye lens assembly, which a patient can use to control the size and/or focus of the image.

In an alternative embodiment, the pellicle or holographic mirrors and thin lenses can be replaced by a binary optical element embodiment in which all of the elements are formed in a thin grating with binary steps. This grating with binary steps is somewhat similar to flat Fresnel grating optical elements.

A low profile, non-conducting visual, audio and physical response system pursuant to the present invention is based upon using a variety of nonconducting materials, such as quartz, glass and plastic polymers, etc. in regions containing the sensitive fields. As illustrated in the several Figures, these materials are fabricated and assembled into a remote binocular or stereo viewing system, an audio channel, and a manual control to be used by the patient. In some embodiments, the lens system is preferably located as close to the lip line as possible so as to be distant from gamma radiation exiting the brain tissue. Only a small thin pellicle type of holographic mirror need be suspended over the eye of the subject.

FIGS. 2 and 3 illustrate embodiments having an all fiber optic transmission system, which is appropriate for short distance, low loss applications. The transmission system has a minimum cross-section structure with an exit pupil near the patients lip line, using long focal length plastic, or polymer, eye lenses. The distance between the lip line and the eye could be covered by a relay lens requiring only a thin lens and pellicle mirror at the eye region. The object is to project a full size, high resolution image to the eye from a region outside the area where gamma radiation is generated within the skull, without disturbing or attenuating the gamma rays.

The light transfer mechanism can be a flexible, or semi-rigid coherent fiber bundle, as shown in FIGS. 1–3. In other embodiments, the light transfer bundle could be supplemented with a relay lens system having conventional lenses, or by a series of large diameter graded refractive index optics (GRIN) lenses, operating in conjunction with a coherent fiber optic bundle configuration, as shown in FIGS. 5–7, to minimize light losses.

FIG. 5 illustrates a possible configuration for an application requiring that an image be generated a substantial distance from the patient in a remote control area. For patients that may not be able to hear or communicate, a remote audio system can be used such as a wall speaker and microphone combination.

FIG. 5 illustrates details of a rigid relay optical assembly 110 which relays an image from a remote television or other display 112 in a remote control room area 113 to a fiber optic bundle 114 for transmission to a display located near a patient within a diagnostic instrument, such as a PET, SPET or MRI diagnostic instrument. The solid relay system passes through a wall 115 separating the remote control room from the instrument area, and passes the image to the coherent fiber optic bundle for transmission to the patient, in a manner similar to that illustrated in FIGS. 2 and 3. As illustrated in the enlarged circle, the relay system can include a periscope fitting 116 at the passage through the wall to provide for safety from any potentially dangerous radiation.

FIGS. 6 and 7 illustrate respectively cross-sections of a conventional relay lens system 120 and a graded index (GRIN) lens relay system 122. An optical relay lens system is appropriate in embodiments wherein large distances must be traversed between the location of the image source (TV, etc.), which sometimes might be located in the control room in order to prevent it from radiating or receiving stray (electrical, magnetic, gamma) radiation. A relay lens system reduces optical losses associated with fiber optic bundles, which because of the longer length might attenuate an excessive amount of light from the relayed image.

Figure 8:
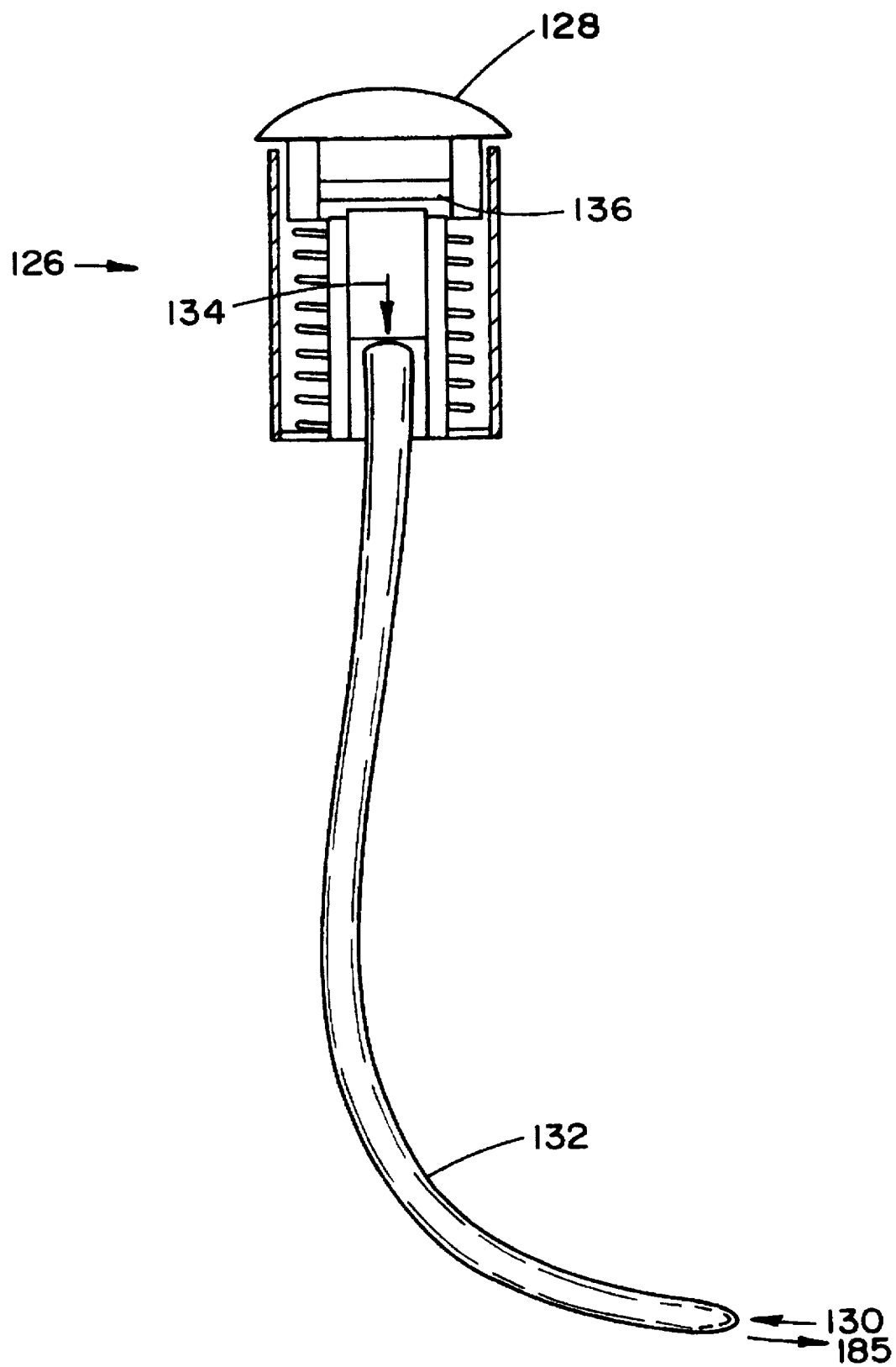
FIG. 8 is a cross-sectional view of a nonconductive variable fiber optic physical response communication system which enables a patient to communicate with a doctor or a technician operating the equipment.

FIG. 8 is a cross-sectional view of a nonconductive variable fiber optic control 126 which enables a patient to communicate with a doctor or a technician operating the diagnostic equipment by a non-metallic fiber optic control button 128 which is used for patient response. In this embodiment, light is received at 130 into an optical fiber 132, and the longitudinal position of the button controls the amount of light reflected back at 134 through the optical fiber as an output at 135. The button 128 controls the position of a linear light varying element 136, which in different embodiments can vary either the amount of light attenuated, or the returned wavelength, or the polarization of the returned light depending upon the longitudinal position of the button 128. The button 128 can be used to control either or both audio and video signals. In alternative embodiments, the fiber optic control button can be replaced or supplemented by a fiber optic joy stick control.

While several embodiments and variations of the present invention for nonconducting, nonradiating remote visual and audio communication systems are described in detail herein, it should be apparent that the disclosure and teachings of the present invention will suggest many alternative designs to those skilled in the art.

What is claimed is:

1. A nonconducting, nonradiating remote communication system for use with medical research, diagnostic, and therapeutic instruments without disturbing the operation of those instruments, comprising:
   a. an image generator for generating an image to be viewed by a patient while the patient is being examined by the instrument;
   b. an optical relay means for relaying the generated image to an eyeglass assembly worn by the patient;
   c. said eyeglass assembly being optically coupled to the optical relay means for receiving an image therefrom and comprising left and right image relay systems for relaying the image to the left and right eyes of the patient.

2. A nonconducting, nonradiating remote communication system as claimed in claim 1, wherein each image relay system includes a relay lens system and a mirror positioned between each relay lens system and each eye to reflect an image onto the eye.

3. A nonconducting, nonradiating remote communication system as claimed in claim 2, wherein the mirror comprises a prism.

4. A nonconducting, nonradiating remote communication system as claimed in claim 2, wherein the mirror comprises a pellicle mirror.

5. A nonconducting, nonradiating remote communication system as claimed in claim 2, wherein the mirror comprises a holographic mirror.

6. A nonconducting, nonradiating remote communication system as claimed in claim 2, wherein the mirror comprises a binary optics mirror.

7. A nonconducting, nonradiating remote communication system as claimed in claim 2, said eyeglass assembly including means for securing the eyeglass assembly to the head of the patient.

8. A nonconducting, nonradiating remote communication system as claimed in claim 7, said securing means including left and right ear-securing temple pieces for extending over the left and right ears of the patient.

9. A nonconducting, nonradiating remote communication system as claimed in claim 2, wherein each relay lens system comprises a graded index relay lens system.

10. A nonconducting, nonradiating remote communication system as claimed in claim 2, wherein each relay lens system comprises a binary optic relay lens system.

11. A nonconducting, nonradiating remote communication system as claimed in claim 1, wherein the optical relay means comprises a fiber optic bundle which extends close to the body of the patient and is secured to the eyeglass assembly in a direction substantially normal to the line of vision of the patient, and the eyeglass assembly transfers the image through a substantially normal angle into the line of vision of the patient.

12. A nonconducting, nonradiating remote communication system as claimed in claim 11, further including a beam splitter secured to the end of the fiber optic bundle for splitting a single image into left and right images to be viewed by the left and right eyes of the patient.

13. A nonconducting, nonradiating remote communication system as claimed in claim 1, wherein the optical relay means includes separate fiber optic bundles for delivering separate independent left and right images to be viewed independently by the left and right eyes of the patient.

14. A nonconducting, nonradiating remote communication system as claimed in claim 1, wherein the optical relay means includes separate relay lens systems for delivering separate independent left and right images to be viewed independently by the left and right eyes of the patient.

15. A nonconducting, nonradiating remote communication system as claimed in claim 1, wherein the image generator includes separate CRT video generators and deflection systems for delivering separate independent left and right images to be viewed independently by the left and right eyes of the patient.

16. A nonconducting, nonradiating remote communication system as claimed in claim 1, wherein said eyeglass assembly includes an image lens, an eye lens, and a mirror.

17. A nonconducting, nonradiating remote communication system as claimed in claim 16, wherein said eye lens is adjustable to control the size or focus of the image.

18. A nonconducting, nonradiating remote communication system as claimed in claim 1, further including a relay lens system optically connecting the image generator to the fiber optic bundle.

19. A nonconducting, nonradiating remote communication system as claimed in claim 16, further including a periscope section in the relay lens system.

20. A nonconducting, nonradiating remote communication system as claimed in claim 16, wherein the relay lens system comprises a graded index relay lens system.

21. A nonconducting, nonradiating remote communication system as claimed in claim 1, further including a hollow audio tube extending to the left and right ears of the patient to enable audio sound messages to be conducted to and heard by the patient.

22. A nonconducting, nonradiating remote communication system as claimed in claim 1, further including an optical transfer transducer which is manually operated by the patient to enable the patient, by manual manipulation of the optical transfer transducer, to communicate messages to the operator of the diagnostic equipment.

23. A nonconducting, nonradiating remote communication system as claimed in claim 1, wherein the image generator includes means for generating a left stereo view and means for generating a right stereo view, the relay means includes left and right fiber optic bundles for relaying the left and right stereo views to the eyeglass assembly which relays the left stereo view to the left eye and relays the right stereo view to the right eye.

24. A nonconducting, nonradiating remote communication system as claimed in claim 23, wherein said eyeglass assembly is optically coupled to the fiber optic bundles for receiving separate images therefrom, and comprises left and right image relay systems for relaying independent stereo images to the left and right eyes of the patient.

* * * * *